United States Patent
Raaijmakers

Patent Number: 6,162,299
Date of Patent: Dec. 19, 2000

[54] MULTI-POSITION LOAD LOCK CHAMBER

[75] Inventor: Ivo J. Raaijmakers, Phoenix, Ariz.

[73] Assignee: ASM America, Inc., Phoenix, Ariz.

[21] Appl. No.: 09/113,767

[22] Filed: Jul. 10, 1998

[51] Int. Cl.[7] .................................................. C23C 16/00
[52] U.S. Cl. .......................... 118/719; 414/217; 414/936; 414/937; 414/939
[58] Field of Search ..................... 118/719; 414/217, 414/937, 936, 939, 935

[56] References Cited

U.S. PATENT DOCUMENTS

| | | | |
|---|---|---|---|
| 3,968,885 | 7/1976 | Hassan et al. | 214/1 BC |
| 5,000,652 | 3/1991 | Christensen et al. | |
| 5,135,349 | 8/1992 | Lorenz et al. | 414/744.6 |
| 5,297,910 | 3/1994 | Yoshioka et al. | |
| 5,447,409 | 9/1995 | Grunes et al. | 414/744.6 |
| 5,590,994 | 1/1997 | Schertler | 414/217 |
| 5,667,592 | 9/1997 | Boitnott et al. | 118/719 |
| 5,743,965 | 4/1998 | Nishimura et al. | |
| 5,754,294 | 5/1998 | Jones et al. | 356/355 |
| 5,824,562 | 10/1998 | Park | 437/288 TR |
| 5,855,465 | 1/1999 | Boitnott et al. | 414/222 |
| 5,863,170 | 1/1999 | Boitnott et al. | 414/222 |
| 5,951,770 | 9/1999 | Perlov et al. | 118/719 |
| 5,993,556 | 11/1999 | Maidhof et al. | 118/719 |

*Primary Examiner*—Jeffrie R Lund
*Attorney, Agent, or Firm*—Knobbe, Martens, Olson & Bear, LLP

[57] ABSTRACT

A machine for manufacturing semiconductor devices has a. processing chamber for processing the semiconductor wafer. A transfer chamber has at least two positions, one position to facilitate the transfer of a wafer to be processed into the transfer chamber and to facilitate the transfer of a processed wafer from the transfer chamber to the cassette from which the wafer originated. The second position facilitates the transfer of a wafer to and from the processing chamber. A transfer arm simultaneously transfers an unprocessed wafer from the first position to the second position with the transfer of a processed wafer from the second position to the first position.

20 Claims, 12 Drawing Sheets

FIG. 7A

| | First Period | Second Period | Third Period | Fourth Period | Fifth Period | Sixth Period | Seventh Period | Eigth Period |
|---|---|---|---|---|---|---|---|---|
| Mechanical Arm 26 | Retrieve | Places | | | | | | |
| Gate valve 61 | Open | | Close | | | | | |
| Load Lock Station 90 | | | | Purge | Lower | | | |

FIG. 7B

| | First Period | Second Period | Third Period | Fourth Period | Fifth Period | Sixth Period | Seventh Period | Eigth Period |
|---|---|---|---|---|---|---|---|---|
| Mechanical Arm 26 | | | | Retrieve | Place | | | |
| Gate valve 61 | | | Open | | Close | | | |
| Load Lock Station 90 | Raised | Purge | | | | | | |

| | First Period | Second Period | Third Period | Fourth Period | Fifth Period | Sixth Period | Seventh Period | Eigth Period |
|---|---|---|---|---|---|---|---|---|
| Wand Station 94 | | Raise | | Lower | | | | |
| Bernoulli wand 36 | Position | | Lift | | Locate | | Place | |
| Gate valve 62 | | | | | | Open | | Close |

*FIG. 7C*

| | First Period | Second Period | Third Period | Fourth Period | Fifth Period | Sixth Period | Seventh Period | Eigth Period |
|---|---|---|---|---|---|---|---|---|
| Wand Station 94 | | | | Lift | | Lower | | |
| Bernoulli wand 36 | | Retrieve | Position | | Place | | | |
| Gate valve 62 | Open | | | | Close | Close | | |

*FIG. 7D*

| | 12th. Period | 13th. Period | 14th. Period | 15th. Period | 16th. Period | 17th. Period | 18th. Period | 19th. Period | 20th. Period | 21st. Period | 22nd. Period |
|---|---|---|---|---|---|---|---|---|---|---|---|
| Cassette Placement Module 12 | | | | | | | | | | | |
| Mechanical Arm 26 | Index | | | | | Index | | | | | Index |
| Rotary Load Lock 50 | | Wafer w1 | | Wafer w5 | | | | Wafer w2 | Wafer w6 | | |
| Load Lock Station 90 | | Wafer w1 | Wafer w1 | Wafer w5 | Wafer w5 | | Wafer w2 | Wafer w2 | Wafer w6 | Wafer w6 | |
| Preprocessing Station 92 | | Wafer w4 | Wafer w4 | Wafer w4 | Wafer w4 | | Wafer w5 | Wafer w5 | Wafer w5 | Wafer w5 | |
| Wand Station 94 | | Wafer w3 | | | | | Wafer w4 | | | Wafer w4 | |
| Post Processing Station 96 | | Wafer w2 | Wafer w2 | Wafer w2 | Wafer w2 | | Wafer w3 | Wafer w3 | Wafer w3 | Wafer w3 | |
| Bernoulli Wand 36 | | | | | | | Wafer w4 | Process w4 | Process w4 | | |
| Process Chamber 20 | | Wafer w3 | Process w3 | Process w3 | Wafer w3 | | Wafer w4 | Process w4 | Process w4 | Wafer w4 | |

FIG. 10B

| | 23rd. Period | 24th. Period | 25th. Period | 26th. Period | 27th. Period | 28th. Period | 29th. Period | 30th. Period | 31st. Period | 32nd. Period | 33rd. Period |
|---|---|---|---|---|---|---|---|---|---|---|---|
| Cassette Placement Module 12 | | Wafer w3 | | | | Wafer w4 | | | Wafer w5 | | Wafer w6 |
| Mechanical Arm 26 | | | | Index | | | | Index | | Index | |
| Rotary Load Lock 50 | Wafer w3 | Wafer w3 | | | Wafer w4 | Wafer w4 | | | Wafer w5 | | Wafer w6 |
| Load Lock Station 90 | Wafer w6 | Wafer w6 | Wafer w6 | | Wafer w6 | | Wafer w6 | | | | |
| Preprocessing Station 92 | Wafer w5 | Wafer w5 | Wafer w5 | | Wafer w5 | | Wafer w5 | | Wafer w6 | | |
| Wand Station 94 | Wafer w4 | Wafer w4 | Wafer w4 | | | | | | | | |
| Post Processing Station 96 | | | | | Wafer w6 | | | | | | |
| Bernoulli Wand 36 | | | | | | | | | | | |
| Process Chamber 20 | Wafer w5 | Process w5 | Wafer w5 | | Wafer w6 | Process w6 | Wafer w6 | | | | |

FIG. 10C 6,162,299

MULTI-POSITION LOAD LOCK CHAMBER

BACKGROUND OF THE INVENTION

The present invention relates to the field of semiconductor wafer processing, and more specifically, to a multi position load lock chamber used in semiconductor wafer processing.

FIG. 1 is an isometric view of a piece of semiconductor manufacturing equipment (an epitaxial reactor 10). The epitaxial reactor 10 is partitioned into the wafer handling chamber 16, load locks 14 and 15, and a process chamber 20 that is isolated from the load locks 14 and 15 and the wafer handling chamber 16 by isolation gate valve 18.

In operation, cassettes of semiconductor wafers (not shown) are placed in the load locks 14 and 15 through load lock portals 32 and 34. After loading the wafer cassettes into the load locks 14 and 15, the load lock portals 32 and 34 are closed to isolate the wafers from the surrounding atmosphere. The load locks are purged by the purge gas that purges out oxygen, moisture and any undesirable particles that may have inadvertently entered the load locks 14 and 15 while the load lock portals 32 and 34 are opened to receive the wafer cassettes.

After completing the purge, the load locks 14 and 15 are opened to the wafer handling chamber by lowering the cassette in an elevator (not shown) which breaks an air tight seal. The wafers are then transported sequentially from the cassettes to the process chamber 20 by a transfer arm 29 that has, for example, a Bernoulli wand end effector 36.

Subsequent to the purging of the load locks 14 and 15 and wafer handling chamber 16, the isolation valve 18 is opened. The transfer arm 29 is used to move the wafers from the load lock 14 or 15 into the process chamber 20 for wafer processing. The transfer arm 29, including a low ingestion Bernoulli wand 36, is within the wafer handling chamber 16. In operation, the Bernoulli wand 36 picks up the semiconductor wafers one at a time from the cassettes (not shown) in one of the load locks 14 and 15. Each wafer is then transported through the open isolation gate valve 18 to a susceptor 38 within the process chamber 20.

After the processing of the wafer is completed, the isolation gate valve 18 is opened and the Bernoulli wand 36 picks up the wafer and returns it to the slot within the same cassette that the wafer was originally retrieved from.

Although the above system is very successful, there is always a desire by the semiconductor manufacturers to increase the throughput of their equipment. However, factory space comes at a premium so that the use of factory floor area for processing equipment must be maintained at a minimum. Additionally, the semiconductor manufacturers appreciate the advantage of performing both preprocessing and post processing operations on semiconductor wafers without affecting the throughput of the processing equipment or the footprint of the equipment on the factory floor.

SUMMARY OF THE INVENTION

A machine for manufacturing semiconductor devices has a processing chamber for processing the semiconductor wafer. A transfer chamber has at least two positions. One position facilitates the transfer of a wafer to be processed into the transfer chamber and facilitates the transfer of a processed wafer from the transfer chamber to the location from which the wafer originated. The second position facilitates the transfer of a wafer to and from the processing chamber. A transfer arm simultaneously transfers an unprocessed wafer from the first position to the second position with the transfer of a processed wafer from the second position to the first position.

In other embodiments there are multiple wafer positions identified that enable the increase in the throughput of the semiconductor apparatus over the prior art machines. At each position, prior to processing, there can be preprocessing operations performed such as cleaning of the wafer, gas treatment, measurements and even a processing step. Similarly, at the wafer position following the processing of a wafer, different post processing procedures can be performed such as measuring the results of the processing step, allowing the wafer to cool down prior to returning it to the cassette, or even performing an additional processing step.

BRIEF DESCRIPTION OF THE DRAWINGS

The invention will be better understood by reference to the following drawings, in conjunction with the accompanying specification, in which:

FIGS. 7a through 7d are timing diagrams illustrating the transfer of wafers through the gate valves;

FIGS. 10a through 10c are timing diagrams illustrating the operation of the rotary load lock 50 in the processing of six wafers;

DETAILED DESCRIPTION OF THE EMBODIMENTS

Figure 1:
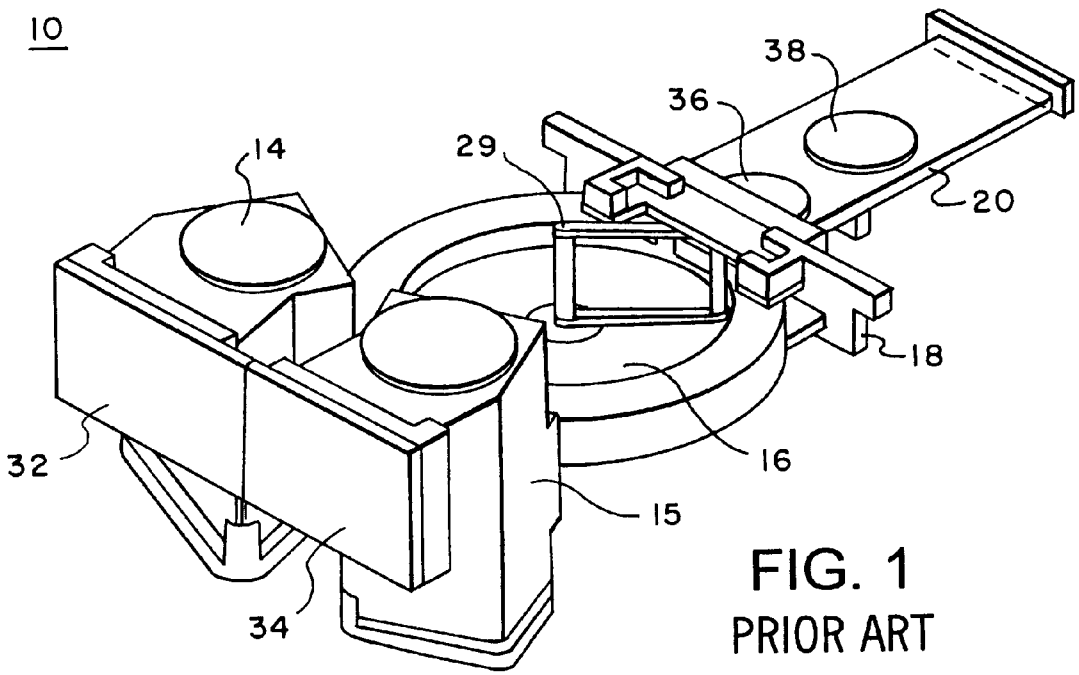
FIG. 1 (Prior Art) is an isometric representation of a prior art wafer processing system.
Figure 2:
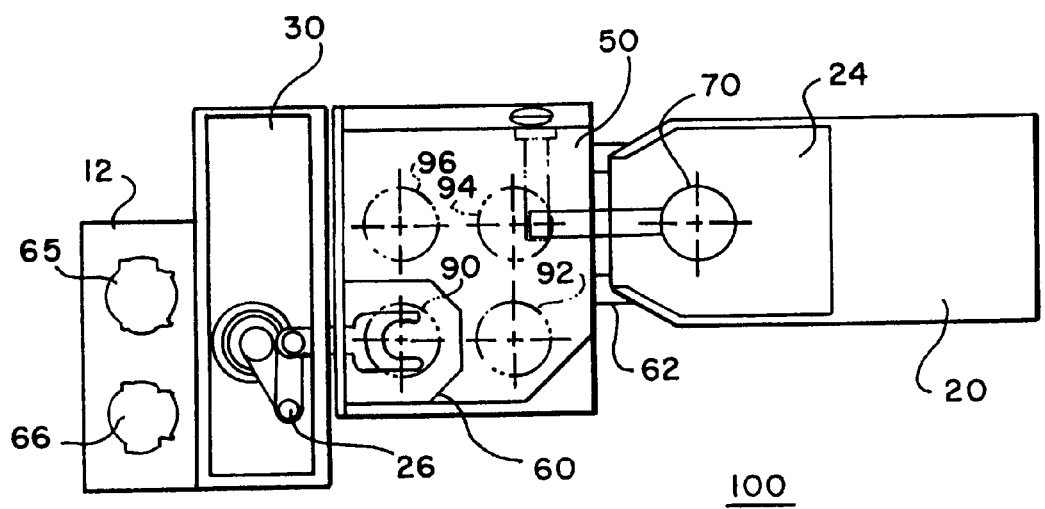
FIG. 2 is a block-type representation of a processing unit constructed according to the present invention.

Turning now to the drawings, there is shown in FIG. 2 a block diagram of a processing unit 100 constructed according to the present invention. As shown in FIG. 2, a processing unit 100 that includes a processing chamber 20, a wafer handling module 50, a cassette to load lock transfer module 30 and a cassette placement module 12. Cassette placement module 12 is where an operator or mechanical device places cassettes 65 and 66 for processing and retrieving the cassettes 65 and 66 at the completion of the processing of all of the wafers. The cassette to load lock transfer module 30 includes a mechanical arm 26 with an end effector, which is known in the art, and is adapted to retrieve a wafer from either cassette 65 or 66 and place the retrieved wafer in a load lock 60 and to retrieve a wafer from the load lock 60 following processing and transfer it to the originating slot within either the cassette 65 or 66 from which it was initially retrieved. The mechanical arm 26 must be able to move in all three coordinates or the cassettes 65 and 66 must be adjustable to the appropriate elevation and/or orientation to allow the mechanical arm to retrieve and return the wafer to the location in the respective cassette.

The processing chamber 20 is separated from the wafer handling module 50 by a gate valve 62. A mechanism 70 in a chamber 24 is used to transfer wafers through gate valve 62 is a Bernoulli wand (such as the devices described in U.S. Pat. Nos. 5,080,549 and 5,324,115 that are incorporated herein by reference). Mechanism 70 transfers wafers between the wafer handling module 50 and the process chamber 20 and in particular to a susceptor within the process chamber 20.

As best seen in FIGS. 2 through 5, wafer handler module 50 having walls 52, 54, 56, and 58 contains a load lock 60 that has a gate valve 61, which is opened and closed by a gate valve actuator. The wafer handler module 50 has four stations that include: a load lock station 90, a preprocessing station 92, a wand station 94, and a post processing station 96. Wafers within the preprocessing station 92 can be pre-measured and pre-cleaned using techniques known in the art. Similarly, wafers in the post processing station can be cooled down after processing and post measurement can be performed such as measuring the thickness of the epitaxial growth layer if the processing chamber is an epitaxial growth chamber and can be measured using techniques known in the art.

Figure 3:
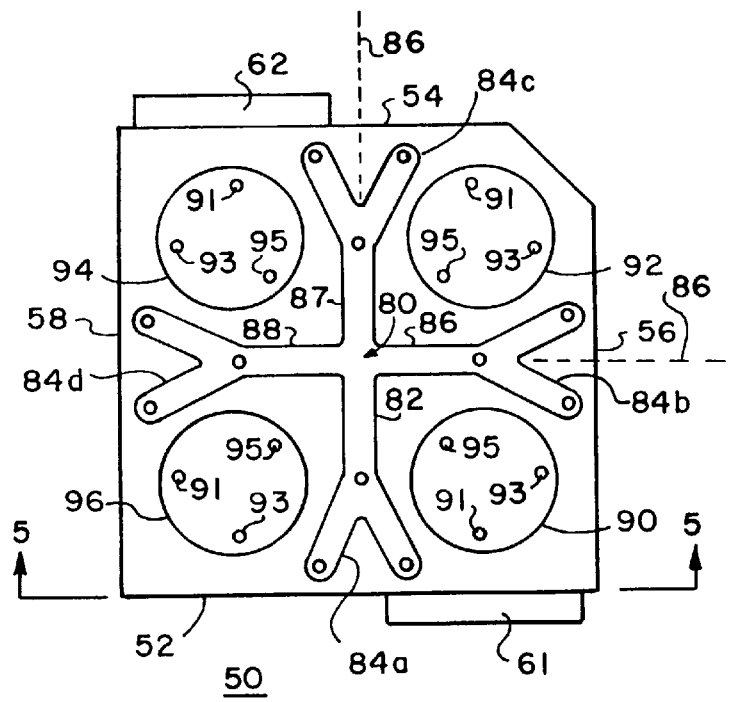
FIG. 3 is a block diagram top plan view of the LOAD LOCK chamber of the present invention.
Figure 4:
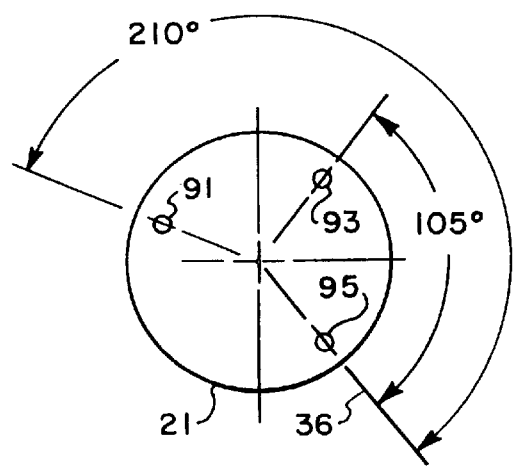
FIG. 4 is a top view of a wafer position plate illustrating the geometric positioning of the wafer pins.

The load lock 60 provides access to the wafer handling module 50 for the mechanical arm 26 so that a wafer can be transferred between a source, such as cassettes 65 and 66, and the load lock station 90. A wafer handler 80, shown in a rest position 86 between the four stations, is comprised of arms 82 and end effectors 84a, 84b, 84c, and 84d for carrying the wafers. The wafer handler 80 rotates between the wafer stations 90, 92, 94 and 96, in such a way that when properly oriented in each position 90, 92, 94 and 96, end effectors 84a through 84d of the wafer handler 80 are selectively centered over load lock station 90, preprocessing station 92, wand station 94, and post processing station 96. When at rest, the arms 82 of the wafer handler are centered between the stations as is shown in FIG. 3. Load lock station 90, preprocessing station 92, wand station 94, and post processing station 96 include a base plate 21 that is approximately the same size as the wafer to be processed and three wafer support pins 91, 93, and 95, which support the wafers at the associated stations. The elevation and orientation of the pins facilitate the end effectors 84a through 84d of the arm 82 to be disposed under the wafers positioned on the pins when the wafer handler 80 is in the low position and is rotating counterclockwise. The geometric orientation of the pins is illustrated in FIG. 4 where pin 95 is the base pin, pin 93 is 105° counterclockwise from pin 95, and pin 91 is 210° counterclockwise from pin 95.

Although the pins 91, 93, and 95 have the same elevation and are fixed to the baseplate it is known in the art to have moveable and retractable pins in wafer processing equipment.

The wafer handler 80 rotates under the control of the actuator 74 and is raised and lowered by lift actuator 76, which are both located underneath the wafer handler module 50. The load lock 60 is mounted above the load lock station 90. An elevator 37 including shaft 63 raises and lowers the plate 21 between the load lock 60 and the wafer handler module 50. When the plate 21 is level with line 35, the top of the pins 91, 93, and 95 are positioned within the gate valve 61 to receive the wafers from the mechanical arm 26. The low position is when the plate 21 of the load lock station 90 is in line with elevation line 41.

The edge 39 of the plate 21 is designed to form an air tight seal with the load lock chamber 60 when the elevator 37 is in the raised position, i.e. the plate 21 is level with line 35. When in the raised position and the gate valve 61 is closed, the load lock chamber 60 may be purged with a purge gas. The purging of load lock is known in the art.

In a similar manner, the gate valve 62 is positioned adjacent a chamber 22 which is over the wand station 94. An elevator 23 including shaft 64 moves the wafers from level 41 to level 27 for positioning the wafers to be retrieved by the end effector mechanism 70. Although end effector 70 can be a standard paddle type end effector, it is preferred that a Bernoulli wand construction be used. In the embodiment shown, the elevators 23 and 37 and actuators 74 and 76 are pneumatic devices.

Figure 5:
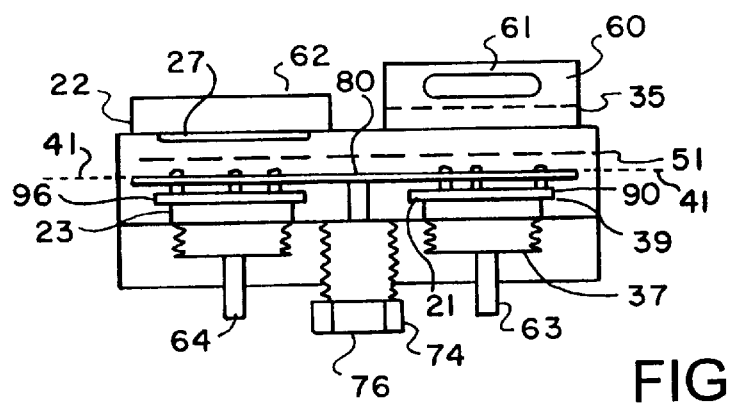
FIG. 5 is a sectional view of the wafer handler, lift fingers and the wafer positions as seen from section lines 5—5.
Figure 6:
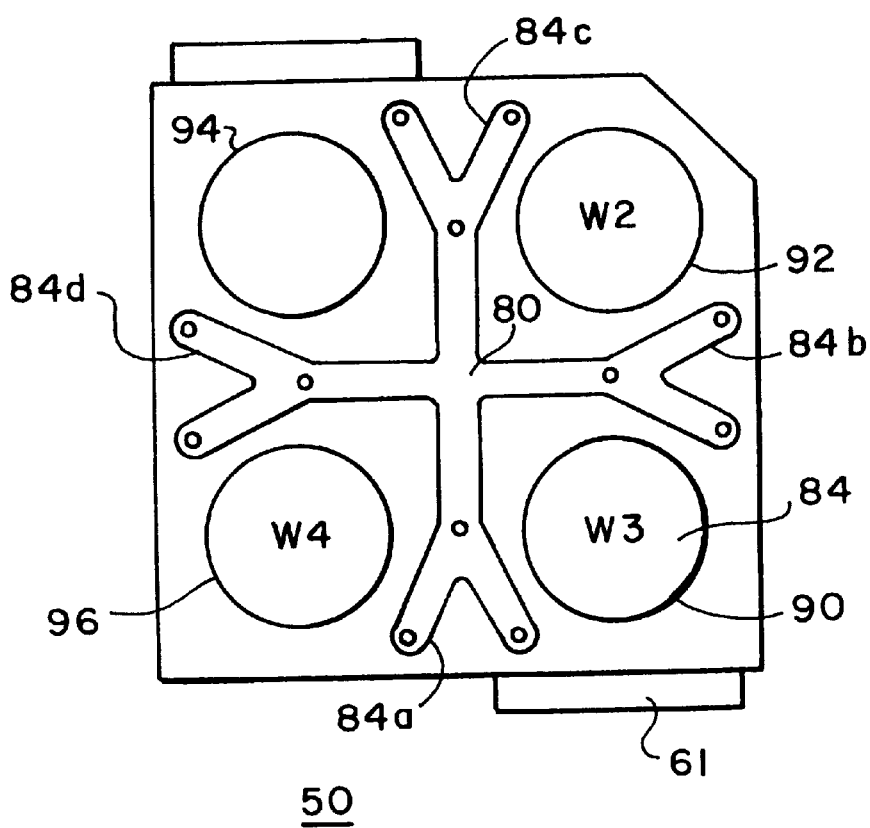
FIGS. 6, 8a, 8b and 9 are top views of the transfer module illustrating the rotation of the wafers through the different stations of the transfer module.

The operation of the rotary load lock can be better understood by referring to the FIGS. 2 through 6, 8a, 8b, 9, and 11 through 13 which shows the apparatus, in conjunction with FIGS. 7 and 10, which shows the positioning of each apparatus. In FIG. 6, the wafer handler 80 is shown in its rest position, a wafer W1 is being processed within the process module 20, a wafer W2 is waiting to be processed in the position 92, and a wafer W3 is being purged in the load lock 60. The elevator 37 is raised into the load lock 60 and the elevator 23 is raised into the gate valve 62. While the elevator 37 is in the raised position and the gate valve 61 is closed, the load lock 60 is purged with a purge gas, simultaneously with the process of wafer W1.

After the processing of wafer W1 is completed, the end effector mechanism 70 transfers the wafer W1 from the processing module 20 onto the pins 91,93 and 95 of the plate 21 located at the wand station 94, which has been raised into the chamber 22 adjacent the gate valve 62. The elevator 23 is then lowered to position 41. Following the purge of the load lock 60, the elevator 37 is lowered to position level 41. The timing for the above operation is given in FIGS. 7a through 7d.

In particular, referring to FIGS. 2 and 5 and the timing diagram illustrated in FIG. 7a the transfer of the wafer from the cassette to the load lock station 90 is depicted. During the first period, the mechanical arm 26 retrieves a wafer from either cassette 66 or 65 and the gate valve 61 is opened. Following the retrieval of the wafer, the mechanical arm 26 places the wafer on the load lock station 90 during the second period. After the mechanical arm 26 is removed, the gate valve 61 is closed during the third period and following that, the load lock 60 is purged. In the fifth period, the elevator 37 is lowered to become in alignment with position line 41.

FIG. 7b illustrates the retrieval of a processed wafer from the load lock station 90 by the mechanical arm 26 and provides for, in the first period, the elevator 37 to raise the wafer to position line 35. In this position, the load lock 60 can then be purged and following which, during the third period, the gate valve 61 is opened. The mechanical arm 26 retrieves the wafer from the pins and places the wafer within one of the cassettes 65 or 66 during the fifth period. Simultaneously with the placement of the wafer, the gate valve 61 is closed.

FIG. 7c illustrates the sequence of operations of the wand station 94. During the first period, the end effector mechanism 70 is positioned to retrieve a wafer from the wand station 94. The wand station is raised into alignment with gate valve 62 which is indicated by position level 51. The end effector mechanism 70 lifts a wafer from the wand station 94 following which the wand station 94 is lowered during the fourth period. In the fifth period, the end effector mechanism 70 and the wafer are positioned to enter the process chamber 20. The gate valve is opened in the sixth period and the wafer is placed on a susceptor within the process chamber 20 and the end effector mechanism 70 leaves the process chamber 20 after which the gate valve 62 is closed during the eighth period.

FIG. 7d provides for removing the processed wafer from the process chamber 20 in which in the first period gate valve 62 is opened and during the second period the end effector mechanism 70 retrieves the wafer. The wafer and end effector mechanism are positioned over the wand station 94 during the fourth period. The wand station 94, in the fourth period, is lifted up and during the fifth period the end effector mechanism 70 places the wafer on the wand station 94 and is removed following which the gate valve is closed and during the sixth period, the wand station 94 is lowered to line 41.

Figure 8A:
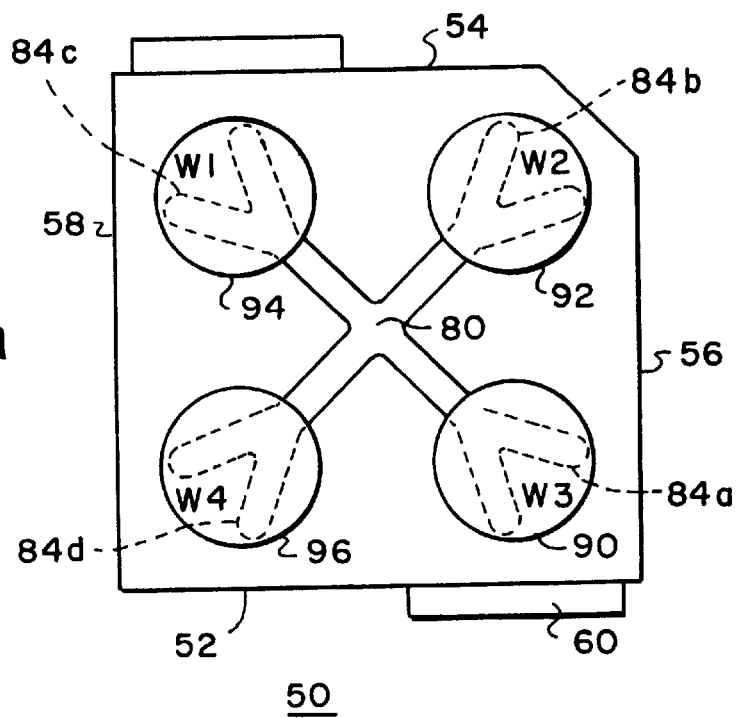

In FIG. 8a, the wafer handler 80 has been rotated 450 counterclockwise so that the end effector 84a is located under wafer W3, end effector 84b is located under wafer W2, end effector 84c is located under the processed wafer W1 and end effector 84d is located at the post processing station 96. At this point the lift actuator 76 raises the wafer handler 80 above the level of the pins 91, 93 and 95 as illustrated by dotted line 51 as shown in FIG. 5 and rotates 90° counter clockwise as is shown in FIG. 9.

Figure 8B:
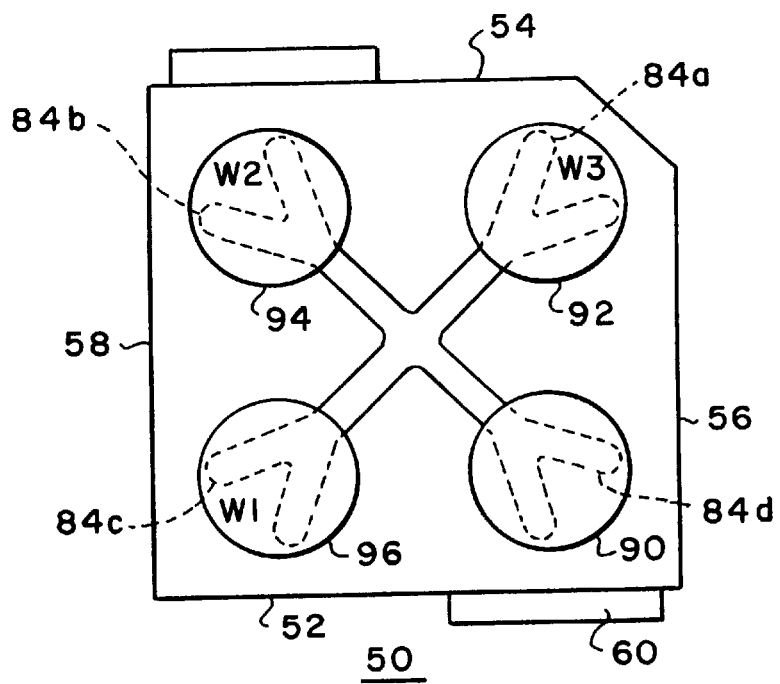
Figure 11:
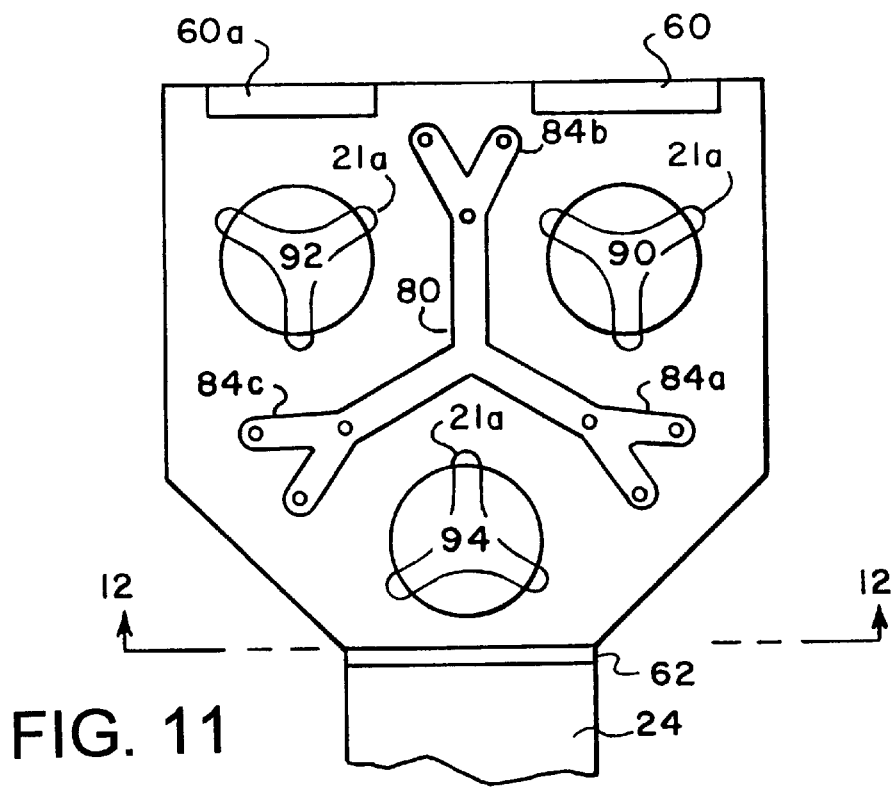
FIG. 11 is a top view of an alternative embodiment of a transfer chamber used in the present invention.

In FIG. 8b, the wafer handler 80 has been lowered by the lift actuator 76 to rest wafer W3 on the pins 91, 93, and 95 located at preprocessing station 92. The wafer handler is then rotated in the rest position as shown in FIG. 3. While at the preprocessing station 92, there can be measurements made on the wafer W3, preprocessing cleaning can be performed on the wafer W3, or as is illustrated in FIG. 11, an initial preprocessing step may be completed. Wafer W2 rests on the pins 91, 93, and 95 at the wand station 94 while wafer W1 is at the post processing station 96. Wafer W2 is waiting to be raised and placed into the processing chamber 20 as is discussed in FIG. 7c. At the post processing station 96, wafer W1 can be cooled down. Additionally, at post processing station 96 measurements can be made such as the thickness of the epitaxial layer that has been made on top of the wafer W1 while it was going through the processing steps or alternatively as can be seen from FIG. 11, other processes may be completed at the post processing station 96.

Figure 9:
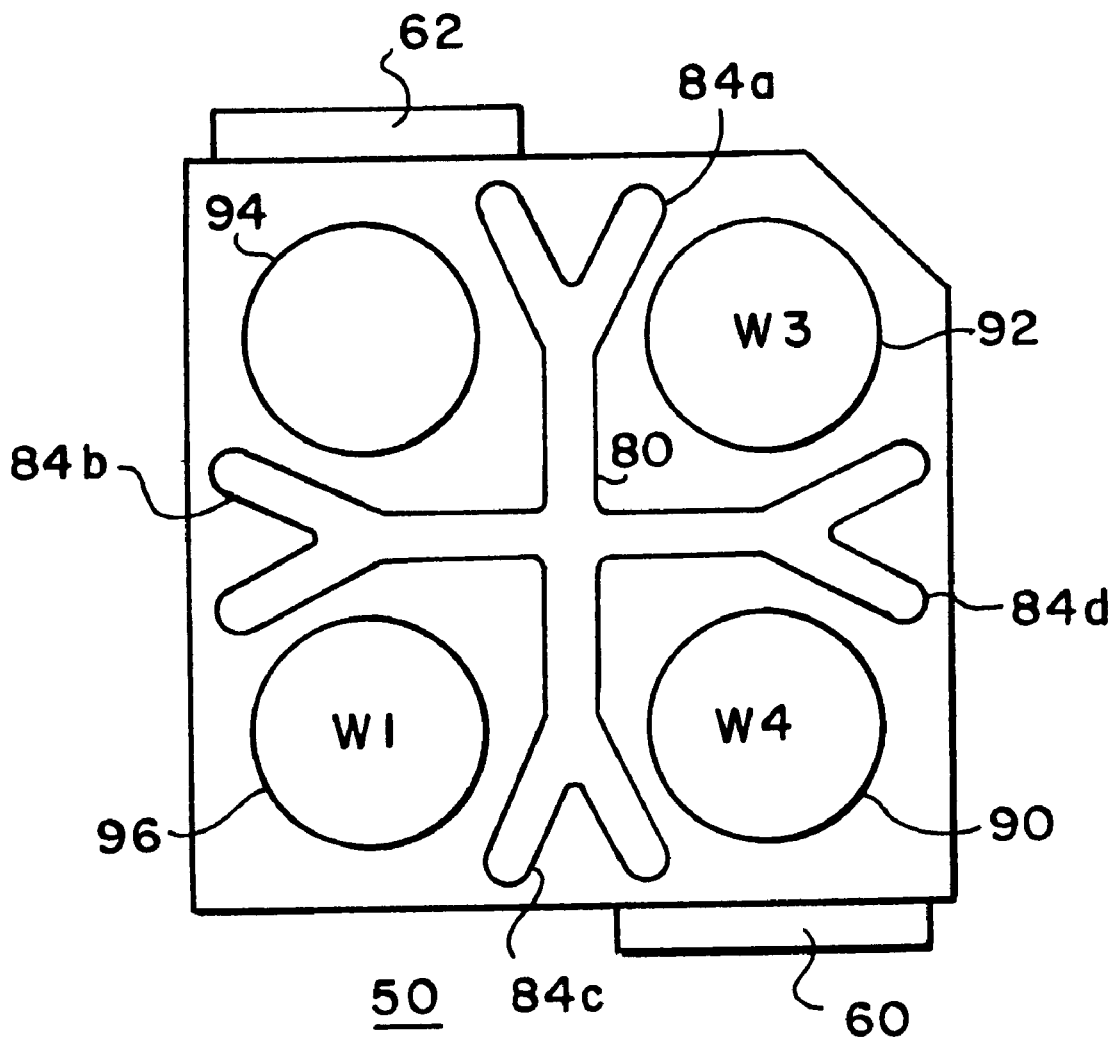

In FIG. 9 elevator 23 has raised wafer W2 into alignment with the gate valve 62 where the end effector 70 retrieved it and placed the wafer W2 in the process chamber 20. Similarly, elevator 37 has been raised into the load lock 60 where mechanical arm 26 has retrieved the wafer W4 from one of the cassettes 65 and 66 and placed in the load lock.

This process is repeated and continues until all of the wafers have been processed.

Figure 10A:
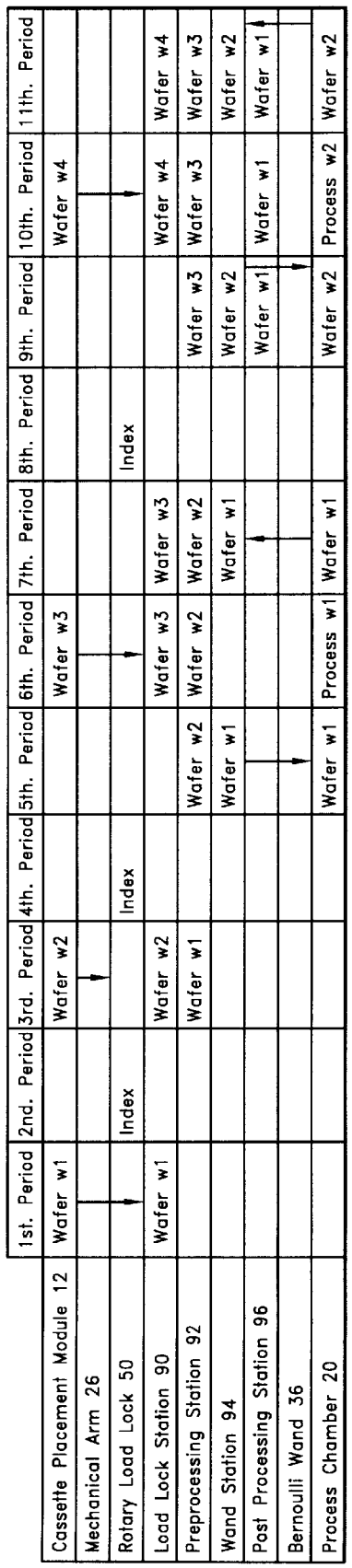

FIGS. 10a through 10c are timing diagrams for the processing of a series of six wafers and should be used in conjunction with FIGS. 2 through 6, 8a, 8b, 9 and 11 through 13. Referring to FIG. 10a, in the 1st. period a wafer W1 is retrieved from a cassette either 65 or 66 located within the cassette placement module 12. The mechanical arm 26 transfers the wafer W1 to the load lock station 90. The rotary handler 80 is then indexed or rotated during the 2nd. period.

In the 3rd. period, the wafer W1 is transferred to the preprocessing station 92 due to the indexing of the rotary handler 80 and a new wafer W2 is transferred from the cassette placement module 12 by the mechanical arm 26 to the load lock station 90. In the 4th. period, the rotary handler 80 is indexed once more, the wafer W1 to the wand station 94 and the wafer W2 to the preprocessing station 92. The wafer W1 next is transferred to the processing chamber by the end effector in the 5th. period.

While the wafer W1 is being processed during the 6th. period, a new wafer W3 is transferred to the load lock station 90 by the mechanical arm 26. After processing, the 7th. period, the wafer W1 is transferred from the process chamber 20 by the end effector to the wand station 94.

The rotary handler 80 is now ready to be indexed in the 8th. period and in the 9th. period. Thus, wafer W2 is transferred to the process chamber 20 from the wand station 94 by the end effector. The wafer W1 is now in the post processing station 96 where different post processing procedures may be implemented or the wafer will just be allowed to cool, and the wafer W3 is located in the preprocessing station 92. The load lock station 90 is now free to receive another wafer which occurs during the 10th period when the mechanical arm retrieves wafer W4 from a cassette in the cassette placement module 12 and loads it into the load lock station 90.

In the 11th. period, the wafer W2 is transferred to the wand station 94 and the rotary handler 80 is now ready to be indexed which it does in 12th. period. In the 13th. period, the wafer W3 is now in the wand station 94 and can be transferred into the process chamber 20 by the end effector 36 during the 13th. period. During the 14th. period, wafer W1 is located at the load lock station 90 and can be retrieved by the mechanical arm 26 and placed within the cassette within the cassette placement module 12. The load lock station 90, thus being empty, is ready to receive another wafer during the 15th. period in which case the mechanical arm 26 transfers wafer W5 from a cassette in the cassette placement module 12 to the load lock station 90. In the 16th. period, wafer W3 is transferred from the process chamber 20 by the Bernoulli wand 70 back to the wand station 94.

The rotary handler 80 is now ready to be indexed which it does during the 17th. period. In the 18th. period, the wafer W4 is now in the wand station 94 and can be transferred to the process chamber 20 by the end effector 70. Similarly, the wafer W2 which has been processed is now in the load lock station 90 and can be retrieved and placed within a cassette within the cassette placement module 12 by the mechanical arm 26 during the 19th. period. The placement of the wafer W2 or within a cassette within the cassette placement module 12 frees the load lock station 90 for the receipt of a new wafer W6 from the cassette placement module 12 which the mechanical arm does retrieve and place within the load lock station 90 during the 20th. period.

In the 21st. period, the processing of wafer W4 is now completed and the end effector 70 retrieves the processed wafer W4 and places it within the wand station 94. The rotary handler 80 indexes during the 22nd. period.

FIG. 10c provides for the final sequence to complete the cycle of processing of the six semiconductor wafers. During the 23rd., wafer W5 is transferred from the wand station into the process chamber 20 by the end effector 70. In the 24th. period the wafer W3 being in the load lock station 90 is transferred to the cassette placement module 12 by the mechanical arm 26. Following the processing of wafer W5, it is transferred during the 25th. period from the process chamber 20 to the wand station 94 by the end effector 70.

The rotary handler 80 is indexed during the 26th. period to place the wafer W4 in the load lock station 90 and wafer W6 in the wand station 90 with wafer W5 being in the post processing station 96. Wafer W6, during the 27th. period is transferred to the process chamber 20 by the end effector 70. In the 28th. period, wafer W4 is transferred from the load lock station 90 to the cassette placement module 12 by the mechanical arm 26. In the 29th. period, the processing of wafer W6 is completed, the end effector 70 retrieves the wafer W6 and places it in the wand station 94.

The rotary handler 80 indexes during the 30th. period and in the 31st. period the wafer W5 is brought into the load lock station 90 where it is transferred to a cassette within the cassette placement module 12 by the mechanical arm 26.

The rotary handler 80 then indexes in the 32nd. period to place wafer W6 at the load lock station 90. This facilitates the mechanical arm 26 retrieving the wafer W6 and placing it within a cassette within the cassette placement module 12. Thus, all of the wafers have been retrieved from a cassette, purged, preprocessed, processed, post processed and returned back to the originating cassette slot.

Figure 12:
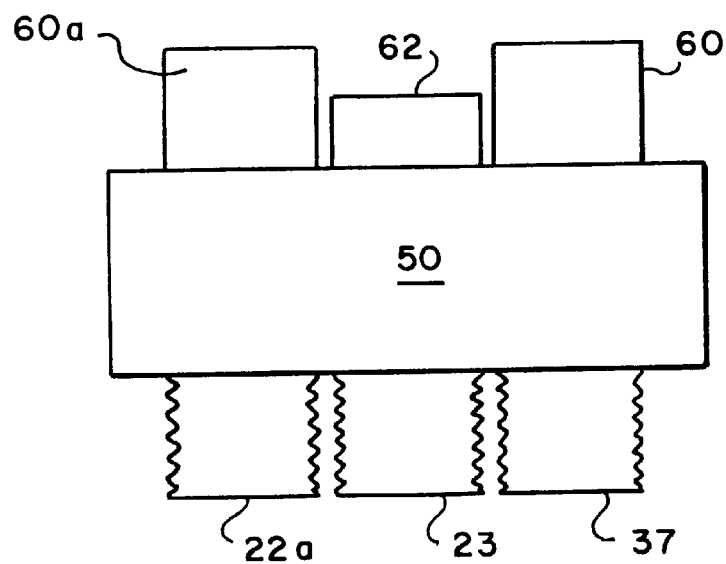
FIG. 12 is a sectional view of the transfer chamber of FIG. 11 as seen from sections 12—12; and, FIG. 13 is an isometric diagram of the wafer holder used in the present invention.

For more than six wafers, it is obvious that the steps in the $15^{th}$ through $19^{th}$ periods must be repeated. In every repeat cycle of steps in the $15^{th}$ through $19^{th}$ periods, all the wafer numbers are increased by one. In FIG. 11 there is shown a top view of a wafer transfer chamber 50 having three stations which are a load lock station 90, a preprocessing station 92 and a wand station 94. As can be seen in FIG. 12, a load lock 60 is positioned above the load lock station 90 that has an elevator lift mechanism 37 associated with the load lock station 90. Similarly, the preprocessing station 92 includes a gate valve 60a. Associated with the gate valve 60a is an elevator mechanism 22a. Additionally, the wand station 94 is situated to interface to the gate valve 62 which is associated with an elevator 23.

As seen in FIGS. 11 and 12, the different positions on the wafer handler module 50 facilitates multiple processes being performed during the transfer of wafers through the different stations instead of preprocessing of post processing stations. There can be a load lock 60 located over station 92 (or the post processing station 96 as described in relation to FIG. 3). This is in addition to its location at the load lock station 90. As discussed, whenever a wafer at the load lock station 90 is located within the load lock 60 the wafer can be subjected a gas purge. Additionally, the wafer can be subjected to an etching step while in that position or some other type of gas treatment. Thus, having the capabilities to locate processing stations or steps with the preprocessing station 92 or the post processing station 96 provides additional versatility to the practitioner of the invention.

Although the invention provides for the raising and lowering of the wafer handler 80, pins 91, 93 and 95 could be raised and lowered. Thus, wafer handler 80 would only be required to rotate in the counterclockwise and clockwise directions.

Finally, to protect the wafers during indexing of rotary handler 80, the wafers are located on wafer holder 21a. The wafer holder is supported by the pins 91, 93 and 95. The wafer, and the end handler 80 is positioned under both the wafer holder 21a and the wafer effector 84 lifts both to index them to the next station. In all other aspects, the rotary load lock 50 operates in the same manner as was previously described except that instead of wafers on the locations 90, 92, 94 and 96, now there are wafer holders and wafers on those locations. The wafer holders support the wafers in the handler module, but are not transferred in the process chamber or cassette.

Figure 13:
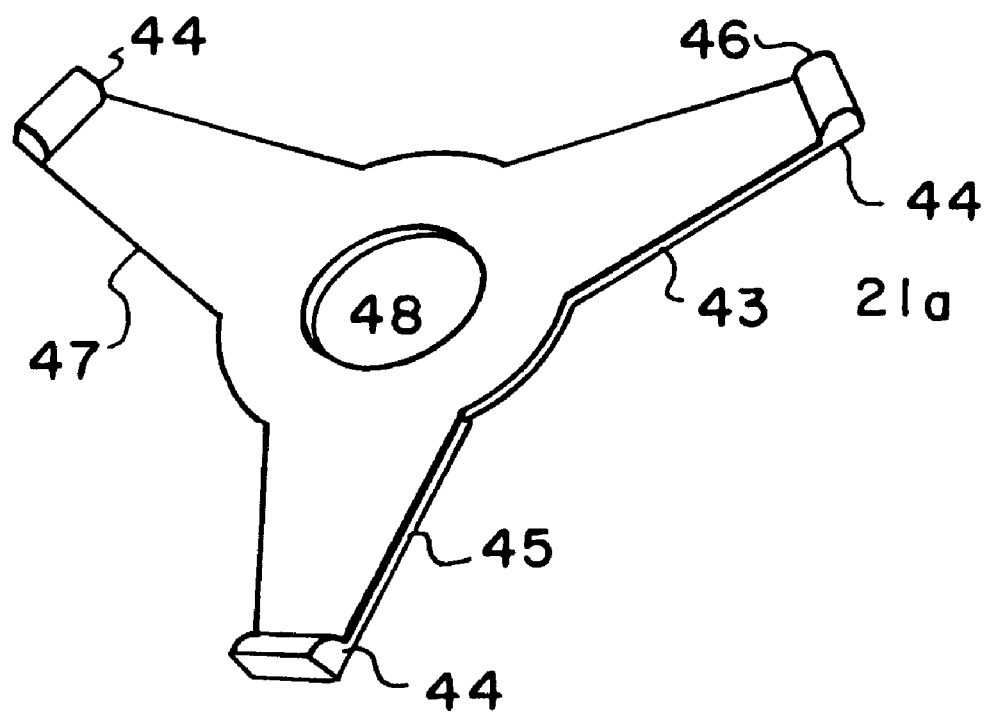

FIG. 13 is an isometric drawing of the wafer holder 21a. It is a light weight metal and formed with three arms 43, 45 and 47 rather than a solid plate so as to be lighter than the plate 21 described in the previous embodiment. Additional weight reduction is provided by opening 48 to support the wafer. At the end of each arm is a quartz wafer support 44. The quartz wafer support has a formed recess to match the outer circumference of the wafer so that only the backside and outer edge of the wafer is in contact with the wafer support 44.

I claim:

1. An apparatus for performing operations on substrates, comprising:
    a substrate handling chamber including a plurality of spaced substrate stations, at least one of which has a base plate for supporting a substrate;
    a substrate handler positioned in said chamber configured to transfer substrates between said stations; and
    an upper chamber positioned above said plate, said base plate being movable upwardly to form a lower wall of said upper chamber to support a substrate, and said base plate being movable downwardly to withdraw the substrate from the upper chamber and to move the substrate to said one station beneath it.

2. The apparatus of claim 1 wherein said wafer handler comprises a rotatable arm configured to move said substrate from an load lock station to an adjacent station.

3. The apparatus of claim 1, wherein said plurality of substrate stations includes a process station, said handling chamber having a valve through which a substrate may be moved between the process station and a process chamber in which the substrate is subjected to a process.

4. The apparatus of claim 1, wherein said upper chamber is a load lock chamber having a valve through which a substrate nay be moved into the load lock chamber.

5. The apparatus of claim 1, including a substrate holder to support a substrate at each of said stations, said substrate handler being adapted to move said substrate holder, carrying a substrate, between said stations.

6. The apparatus of claim 5, including a plurality of support pins at each of said stations for supporting said substrate holder.

7. The apparatus of claim 1, including a plurality of supports at each of said stations for supporting a substrate.

8. The apparatus of claim 1, wherein said substrate handler is movable vertically to raise or lower a substrate.

9. The apparatus of claim 1, wherein said plurality of stations includes a preprocessing station adjacent said load lock station.

10. The apparatus of claim 9, wherein said preprocessing station is a substrate preclean station.

11. The apparatus of claim 9, wherein the preprocessing station is a substrate premeasurement station.

12. The apparatus of claim 1, wherein said plurality of stations includes a preprocessing station, and a postprocessing station located between a load lock station and a process station.

13. The apparatus of claim 12, wherein said preprocessing station is a substrate preclean station.

14. The apparatus of claim 12, wherein said preprocessing station is a substrate premeasurement station.

15. The apparatus of claim 1, wherein said plurality of stations includes a post-processing station positioned between a process station and a load lock station.

16. The apparatus of claim 15, wherein said post-processing station is a substrate measurement station.

17. The apparatus of claim 15, wherein said post-processing station is a substrate cooling station.

18. The apparatus of claim 1, wherein said handler has a plurality of arms configured to move simultaneously a substrate from each station to an adjacent station.

19. An apparatus for performing operations on substrates, comprising:

a substrate handling chamber including a plurality of spaced substrate stations;

a substrate holder at each of said stations, each configured to support a substrate;

a plurality of supports at each of said stations configured to support one of said holders; and a rotatable substrate handler centrally positioned with respect to said stations and having a plurality of radially-extending arms equal in number to the number of stations, each of said arms being configured to extend beneath one of said holders at each of said stations, said handler together with said arms being vertically movable so that said arms can each lift one of said holders supporting a substrate and move the substrate to an adjacent station without contacting the substrate.

20. The apparatus of claim 19, wherein each of said holders has a plurality of arms adapted to engage the outer edges of a substrate, each of said holders further having a central portion which is spaced below a substrate when the substrate is supported by the holder arms so as to enable an end effector to be inserted between a substrate and the holder to transfer a substrate to and from a holder.

* * * * *